(12) United States Patent
Aita et al.

(10) Patent No.: US 7,608,871 B2
(45) Date of Patent: Oct. 27, 2009

(54) SOLID IMAGE PICK-UP ELEMENT WITH A SINGLE LAYER ELECTRODE STRUCTURE AND METHOD OF PRODUCING THE SAME

(75) Inventors: Tsutomu Aita, Miyagi (JP); Hideki Kooriyama, Miyagi (JP); Maki Saito, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 554 days.

(21) Appl. No.: 10/570,130

(22) PCT Filed: Jun. 30, 2005

(86) PCT No.: PCT/JP2005/012518

§ 371 (c)(1),
(2), (4) Date: Mar. 1, 2006

(87) PCT Pub. No.: WO2006/004168

PCT Pub. Date: Jan. 12, 2006

(65) Prior Publication Data

US 2008/0217660 A1    Sep. 11, 2008

(30) Foreign Application Priority Data

Jun. 30, 2004  (JP) ............................. 2004-192774
Jun. 7, 2005   (JP) ............................. 2005-166927

(51) Int. Cl.
*H01L 21/62*    (2006.01)

(52) U.S. Cl. .................. 257/291; 257/222; 257/225; 257/233; 257/240; 257/245; 257/258; 257/232; 257/226; 257/292; 257/293; 257/E27.15; 257/E27.132

(58) Field of Classification Search ............. 257/222, 257/225, 226, 233, 240, 245, 258, 232, 291–293, 257/E27.15, E27.132
See application file for complete search history.

(56) References Cited

U.S. PATENT DOCUMENTS 5,241,198 A    8/1993  Okada et al.
6,518,605 B1   2/2003  Hatano et al.

FOREIGN PATENT DOCUMENTS

| EP | 0 492 144 A2 | 7/1992 |
| JP | 5-182992 A | 7/1993 |
| JP | 11-26743 A | 1/1999 |
| JP | 2003-332554 A | 11/2003 |
| JP | 2004-55669 A | 2/2004 |
| WO | WO-2005/114735 A1 | 12/2005 |

*Primary Examiner*—Andy Huynh
(74) *Attorney, Agent, or Firm*—Birch, Stewart, Kolasch & Birch, LLP

(57) ABSTRACT

A solid image pick-up element comprises: a photoelectric converting portion; a charge transmitting portion comprising a charge transmitting electrode that transmits a charge generated by the photoelectric converting portion; and a peripheral circuit portion connected to the charge transmitting portion, wherein a surface level of a field oxide film provided at the peripheral circuit portion and the charge transmitting portion to surround an effective image pick-up region of the photoelectric converting portion is to a degree the same as a surface level of the photoelectric converting portion.

8 Claims, 12 Drawing Sheets

SOLID IMAGE PICK-UP ELEMENT WITH A SINGLE LAYER ELECTRODE STRUCTURE AND METHOD OF PRODUCING THE SAME

TECHNICAL FIELD

The present invention relates to a solid image pick-up element and a method of producing the same, particularly relates to a solid image pick-up element having a structure of withstanding miniaturization and a method of producing the same.

BACKGROUND ART

A solid image pick-up element using CCD used for an area sensor or the like includes a photoelectric converting portion of a photodiode or the like, and a charge transmitting portion having a charge transmitting electrode for transmitting a signal charge from the photoelectric converting portion. A plurality of pieces of charge transmitting electrodes are arranged contiguously on a charge transmitting path formed at a semiconductor substrate and are successively driven.

In recent years, in a solid image pick-up element, a request for high resolution formation and high sensitivity formation is more and more increasing and an increase in a number of image pick-up pixels is progressed to more than giga pixels. Under such a situation, in order to achieve high resolution without making a chip size large-sized, it is necessary to achieve highly integrated formation by reducing an area per unit pixel.

On the other hand, when an area of a photodiode constituting a photoelectric converting portion is reduced, a sensitivity is deteriorated and therefore, an area of a photodiode region needs to be ensured. Hence, various researches have been carried out in order to achieve miniaturization of a chip while ensuring an area occupied by the photodiode region by achieving miniaturization of wirings of a charge transmitting portion and a peripheral circuit and reducing a rate of areas of the wirings.

Under such a situation, it becomes an important technical problem to maintain flatness of an interlayer insulating film between wiring layers in order to realize highly integrated formation by miniaturization of the wirings. Furthermore, a substrate (silicon substrate) fabricated with a solid image pick-up element is mounted by being laminated with a filter and a lens. Therefore, positional accuracies of the lens and the photoelectric converting portion become important and a distance thereof, that is, a distance in a height direction becomes a significant problem in view of positional accuracy in producing steps and a sensitivity (photoelectric conversion efficiency) when used.

Hence, in order to promote flatness, there is proposed a structure in which the charge transmitting portion is constructed by a structure of a single layer electrode. In CCD, a gap between electrodes becomes an important factor for determining a transmitting efficiency and it is important how to reduce the gap between electrodes. However, in forming an electrode pattern by a normal photolithography technology, 1 μm constitutes a limit and it is difficult to form the gap smaller than 1 μm. Further, in miniaturization of a distance between electrodes, also an aspect ratio is obliged to be enlarged and also a technology of embedding an insulating film to the gap between electrodes which is very small and is provided with the large aspect ratio is also extremely difficult.

Therefore, miniaturization of the gap between electrodes is extremely serious and promotion of pattern accuracy becomes a serious problem. Further, also miniaturization of a peripheral circuit portion is similarly requested. Under such a situation, a flatness of a surface of a substrate becomes an extremely important problem in promoting the pattern accuracy in the photolithography step and filling the insulting film into the gap between electrodes. Although in a background art, various trials have been carried out in pursuit for the flatness of the surface, the request for promoting the pattern accuracy accompanied by miniaturization is more and more increasing all the more.

Further, according to a solid image pick-up element using a charge transmitting electrode having a single layer structure of a background art, in miniaturization of a gap between electrodes, in order to achieve miniaturization exceeding a resolution of photolithography, there is also proposed a method of achieving flatness by resist etch back or CMP (chemical mechanical polishing) method after forming a pattern of a first layer conductive film and thereafter forming an insulting film between electrodes and laminating a second layer conductive film at an upper layer thereof.

For example, single layer formation of an electrode is carried out by using a polycrystal silicon or an amorphous silicon film as a charge transmitting electrode, forming a first layer wiring, thereafter, oxidizing a surface of a pattern of the first layer wiring, piling up a polycrystal silicon or an amorphous silicon film constituting a second layer of a transmitting electrode, coating a resist and etching an entire face thereof by a resist etch back method.

An example thereof will be explained in reference to FIG. 10 through FIG. 12. First, a surface of an n-type silicon substrate 1 is formed with a field oxide film having a film thickness of about 600 nm at a region surrounding an image pick-up region by LOCOS method to isolate elements and thereafter an element region is formed. That is, a silicon oxide film 2a having a film thickness of 15 through 35 nm, a silicon nitride film 2b having a film thickness of 50 nm and a silicon oxide film 2c having a film thickness of 10 nm are formed to form a gate oxide film 2 having a three layers structure. At this occasion, a surface of the substrate before forming the element region is brought into a state of projecting a field oxide film 10.

Successively, a first layer doped amorphous silicon film 3a having a film thickness of 250 nm is formed on the gate oxide film 2 and a silicon oxide film 4a and a silicon nitride film 4b are formed (FIG. 10A).

Successively, a resist is coated at an upper layer thereof.

Further, as shown by FIG. 10B, exposure, development and rinsing are carried out by using a desired mask by photolithography to form a resist pattern R1 having a pattern width of 0.3 through several μm.

Thereafter, as shown by FIG. 10C, by constituting a mask by the resist pattern R1, the silicon oxide film 4a and the silicon nitride film 4b are etched to form a mask pattern for patterning a first electrode.

Further, the resist pattern is exfoliated to remove by ashing (FIG. 11D), by constituting a mask by the mask pattern, constituting an etching stopper by the silicon nitride film 2b of the gate oxide film 2, the first layer doped amorphous silicon film 3a is etched to remove to form the first electrode (FIG. 11E).

Successively, an insulating film between electrodes 5 is formed at a surface of the pattern of the first electrode by thermal oxidation (FIG. 11F), further, a silicon oxide film (HTO oxide film) 6 is formed at an upper layer thereof (FIG. 12G).

Further, a second layer doped amorphous silicon film 3b is formed at an upper layer thereof (FIG. 12H).

Thereafter, the second layer doped amorphous silicon film 3b is flattened by CMP (FIG. 12I).

In this way, a second electrode comprising the second layer doped amorphous silicon film 3b is formed to form a solid image pick-up element electrode having a flat surface.

In the case of the method, when the second electrode is formed by separating the second layer doped amorphous silicon film by removing the second layer doped amorphous silicon film on the first electrode by flattening to remove the second layer doped amorphous silicon film by CMP, the field oxide film 10 is higher than the surface of the first electrode and cannot be machined by CMP.

The same goes with resist etch back.

In this way, there is a case in which a height of a nonimage pick-up region formed with an amplifying circuit or the like becomes lower than that of an effective image pick-up region having a charge transmitting electrode. In such a case, there poses a problem that machining by CMP is difficult. Further, also in the case of flattening by resist etch back, separation of electrodes by flattening similarly becomes difficult.

Further, there is also proposed a constitution in which a height of a surface formed with a field oxide film is formed to be lower than a height of a surface of a charge transmitting electrode in order to enable to carry out machining by CMP (JP-A-11-26743).

However, even when separation of electrodes can be carried out, in the case in which the surface of the substrate is not sufficiently flat, the pattern accuracy of the first layer doped amorphous silicon film cannot sufficiently be achieved. The more miniaturized the pattern, the more the problem is brought into a serious state, and in miniaturization, the problem is revealed.

However, even when the filed oxide film is lower than the electrode, in the case of forming a wiring on a field oxide film, a stepped difference is brought about to pose a problem of bringing about a nonuniformity in a sensitivity or color at a peripheral portion of an image pick-up screen.

Furthermore, when a region having a small density of the first layer doped amorphous silicon film is disposed at a peripheral edge portion of a wafer, in the case of forming a resist by spin coating, a surface level of the resist becomes low, as a result, there is a case of bringing about a reduction in the second doped amorphous silicon film at the peripheral edge portion of the wafer.

Further, at the region having the small density of the first doped amorphous silicon film not only at the peripheral edge portion of the wafer but also a region other than a wiring region and a photodiode portion on a semiconductor substrate, there is a case of forming a region having a thin resist pattern. In such a case, a problem of bringing about a dispersion in a wiring resistance is posed.

In such a case, there poses a problem of bringing about a dispersion in a wiring resistance at a periphery. Further, there also is a case of deteriorating a transmitting efficiency by a dispersion in a film thickness of a charge transmitting electrode at a peripheral portion. Further, the dispersion increases a nonuniformity in film thicknesses and dispersion in shapes of various films of a flattened film, a microlens, a color filter and the like of layers upward from the charge transmitting electrode to also pose a problem of bringing about shading, a dispersion in sensitivity and a deterioration of smear by stray light.

Therefore, there poses a problem that it is difficult to deal with miniaturization or a further increase in a sensitivity by the above-described methods.

In this way, according to the solid image pick-up element of the background art, in accordance with miniaturization, flatness of the surface of the semiconductor substrate becomes a serious problem and a higher degree of flatness to a degree which is not conceivable by a size of the background art has been requested.

DISCLOSURE OF THE INVENTION

The invention has been carried out in view of the above-described actual situation and it is an object thereof to provide a solid image pick-up element having high accuracy and high reliability even in a high degree of miniaturization.

Further, it is an object of the invention to provide a solid image pick-up element of a single layer electrode structure having high accuracy and high reliability even in a high degree of miniaturization.

Further, it is an object of the invention of the invention to achieve an improvement in a charge transmitting efficiency by forming a uniform and highly reliable charge transmitting electrode even in miniaturization and thin film formation of an electrode pattern in forming a charge transmitting electrode of a single layer of electrode structure by forming a second layer conductive film on a pattern of a first layer conductive film and removing the second layer conductive film on the first layer conductive film to flatten.

Hence, according to the invention, there is provided a solid image pick-up element comprising: a photoelectric converting portion; a charge transmitting portion comprising a charge transmitting electrode that transmits a charge generated by the photoelectric converting portion; and a peripheral circuit portion connected to the charge transmitting portion, wherein a surface level of a field oxide film provided at the peripheral circuit portion and the charge transmitting portion to surround an effective image pick-up region of the photoelectric converting portion is to a degree the same as a surface level of the photoelectric converting portion.

According to the constitution, the surface level of the field oxide film provided at the peripheral circuit portion and the charge transmitting portion to surround the effective image pick-up region of the photoelectric converting portion is to the degree the same as the surface level of the photoelectric converting portion and therefore, in forming an element region, a total of the surface of the substrate becomes flat, pattern accuracy by photolithography is considerably promoted, which is effective not only in the case of a two layers electrode structure but also in the case of a single layer electrode structure.

Further, since the surface level is flat, a reduction in a conductive film, particularly a second layer conductive film produced by constituting a charge transmitting electrode by the single layer can be prevented. Therefore, the charge transmitting electrode and the peripheral circuit having a uniform film thickness can be formed and therefore, a dispersion in an element characteristic can be prevented and the highly reliable solid image pick-up element can be formed. Further, although when a resist is coated by spin coating, the surface level of the resist is liable to be lowered at a peripheral edge portion of a wafer, it is preferable to lift the surface level of the resist by a dummy pattern at a region at which the surface level of the resist is liable to be lowered even at a region other than the peripheral edge portion.

Here, the effective image pick-up region includes the photoelectric converting portion and the charge transmitting portion.

Further, in a flattening step of a CMP (chemical mechanical polishing) step or an etch back step of the second layer conductive film, it is preferable that the surface level of the photoelectric converting portion is to a degree the same as that of a surface level of the charge transmitting portion forming the charge transmitting electrode and an upper face of the gate oxide film at the peripheral circuit portion and it is preferable that at least the surface level of the substrate of the region formed with the photoelectric converting portion and the surface level of the field insulating film are to the same degree.

Further, according to the invention, there is provided the solid image pick-up element, wherein the charge transmitting electrode has a single layer electrode structure comprising a first electrode and a second electrode formed via an insulting film between electrodes covering a side wall of the first electrode.

By the constitution, the surface level is flat and therefore, a highly accurate pattern can be formed, and the single layer electrode structure including the first electrode and the second electrode can also be formed by patterning one layer of the conductive film. Therefore, the charge transmitting electrode and the peripheral circuit having the uniform film thickness can be formed and therefore, a dispersion in the element characteristic can be prevented and a highly reliable solid image pick-up element can be formed.

Further, the solid image pick-up element of the invention comprises a constitution in which the first electrode comprises a first layer conductive film, and the second electrode comprises a second layer conductive film.

By the constitution, the surface level is flat and therefore, a reduction in the conductive film, particularly the second layer conductive film produced in constituting the charge transmitting electrode by the single layer can be prevented. Therefore, the charge transmitting electrode and the peripheral circuit having the uniform film thickness can be formed and therefore, a dispersion in the element characteristic can be prevented and the highly reliable solid image pick-up element can be formed.

Further, the solid image pick-up element of the invention comprises a constitution in which the field oxide film is a film formed by selective oxidation (LOCOS).

By the constitution, LOCOS which is liable to be projected to the surface is flattened and therefore, the silicon substrate having the flat surface structure can be used as a starting material.

Further, the solid image pick-up element of the invention comprises a constitution in which the field oxide film is formed in a trench.

Further, the solid image pick-up element of the invention comprises a constitution in which the field oxide film is an insulating film filled in a trench.

By the constitution, the trench may be formed and the insulting film may be filled to inside thereof and therefore, flattening can be carried out further easily.

Further, the solid image pick-up element of the invention comprises a constitution in which the first layer conductive film is provided with a dummy pattern on the field oxide film.

By the constitution, pattern accuracy of the conductive film can be promoted by forming a dummy pattern at a region having a small pattern density. Further, although the film thickness of the resist is reduced and the surface level is liable to be lowered at the region at which the pattern density is small such as the wiring region on the semiconductor substrate, a region other than the photodiode portion or the like, particularly, the peripheral edge portion of the wafer, according to the constitution, by adding the dummy pattern, prior to resist etch back, the surface level can be prevented from being lowered also at the peripheral edge portion and therefore, a reduction in a silicon species conductive film, particularly a second layer silicon species conductive film produced in constituting the charge transmitting electrode by the single layer can be prevented.

Further, according to the invention, there is provided a method of producing a solid image pick-up element which comprises a photoelectric converting portion, a charge transmitting portion comprising a charge transmitting electrode having a single layer electrode structure for transmitting a charge generated by the photoelectric converting portion, and a peripheral circuit portion connected to the charge transmitting portion, the method including a step of flattening a total of a surface of a semiconductor substrate after forming a field oxide film on the surface of the semiconductor substrate and before forming the charge transmitting electrode.

By the method, the field oxide film for isolating the element is formed, thereafter, the surface is flattened and therefore, highly accurate flatness can be achieved.

Further, the method of producing a solid image pick-up element of the invention comprises a constitution further comprising a step of forming a trench at a region of forming the field oxide film provided at the peripheral circuit portion and the charge transmitting portion to surround an effective image pick-up region of the photoelectric converting portion, a step of forming the field oxide film in the trench, a step of flattening the surface of the semiconductor substrate formed with the field oxide film, and a step of forming element portions of the charge transmitting electrode, the photoelectric converting portion and the peripheral circuit portion on the surface of the semiconductor substrate.

By the method, the surface can easily be flattened. In this case, there also is a case in which the flattening step is not particularly needed when a depth of the trench and the thickness of the field oxide film can be formed to coincide with each other.

Further, the method of producing a solid image pick-up element of the invention of the invention includes a constitution in which the step of forming the field oxide film comprises a step of selective oxidation (LOCOS).

According to the method, the field oxide film having an excellent film quality can be formed although a long period of time is required.

Further, the method of producing a solid image pick-up element of the invention comprises a constitution in which the step of forming the field oxide film comprises a step of filling an insulting film to the trench by a CVD method.

According to the method, a time period required for forming the field oxide film can be shortened.

Further, both of LOCOS and CVD may be used and a plurality of methods may be used in the same substrate face such that LOCOS is used at a vicinity of an amplifying portion at which importance is given to isolation of the element and CVD is used at a portion at which importance is given to flatness.

Further, the method of producing a solid image pick-up element of the invention comprises a constitution in which the step of flattening the surface of the semiconductor substrate comprises a step of coating a resist by a spin coating method on the surface of the semiconductor substrate, and a step of flattening the surface of the semiconductor substrate by a resist etch back method.

Further, the method of producing a solid image pick-up element of the invention comprises a constitution in which the step of flattening the surface of the semiconductor substrate comprises a step of flattening the surface of the semiconductor substrate by a CMP (chemical mechanical polishing) method.

Further, the method of producing a solid image pick-up element of the invention comprises a constitution in which the step of forming the element portions comprises a step of forming a pattern of a first layer-conductive film constituting a first electrode, the photoelectric converting portion and a first layer wiring for the peripheral circuit portion on the flattened surface of the semiconductor substrate, a step of forming an insulating film between electrodes at least a side wall of the first electrode, a step of forming a second layer conductive film constituting a second electrode on the surface of the semiconductor substrate formed with the first electrode and the insulting film between electrodes and a step of flattening the second layer conductive film.

Further, the method of producing a solid image pick-up element of the invention comprises a constitution in which the step of flattening the second layer conductive film comprises a step of coating a resist at an upper layer of the second layer conductive film by a spin coating method, and a step of flattening the second layer conductive film by a resist etch back method.

Further, the method of producing a solid image pick-up element of the invention comprises a constitution in which the step of forming the pattern of the first layer conductive film comprises a step of forming the pattern including a dummy pattern such that a surface level of the resist does not become to be equal to or smaller than a predetermined value on the semiconductor substrate.

Further, the method of producing a solid image pick-up element of the invention comprises a constitution in which the step of flattening the second layer conductive film includes a step of flattening the second layer conductive film by a CMP (chemical mechanical polishing) method.

Further, the method of producing a solid image pick-up element of the invention comprises a constitution in which the step of forming the pattern of the first layer conductive film includes a step of forming the pattern including a dummy pattern such that a surface level of the second layer conductive film does not become equal to or smaller than a predetermined value on the semiconductor substrate.

Although at a region having a small pattern density of the wiring portion, a region other than the photodiode portion or the like on the semiconductor substrate, particularly at a peripheral edge portion of the wafer, the film thickness of the resist is reduced and the surface level is liable to be lowered, according to the constitution, by adding the dummy pattern, prior to resist etch back, the surface level can be prevented from being lowered even at the peripheral edge portion and therefore, a reduction in the conductive film, particularly the second layer conductive film produced in constituting the charge transmitting electrode by the single layer can be prevented. Therefore, the charge transmitting electrode and the peripheral circuit having the uniform film thickness can be formed and therefore, the dispersion in the element characteristic can be prevented and the highly reliable solid image pick-up element can be formed. Further, although when the resist is coated by spin coating, the surface level of the resist is liable to be lowered at the peripheral edge portion of the wafer, it is preferable to increase the surface level of the resist by the dummy pattern at the region at which the surface level of the resist is liable to be lowered even at the region other than the peripheral edge portion.

Further, according to the invention, there is provided the method of producing a solid image pick-up element, further comprising a step of forming a stopper layer constituting an etching stopper on the surface of the first electrode prior to the step of forming the second layer conductive film, wherein the flattening step is a step for executing resist etch back by constituting a stopper by the stopper layer.

By the constitution, etching can be stopped on the first electrode without machining the first electrode and therefore, a charge transmitting portion having an excellent flatness and a high yield can be formed. Here, when the second layer conductive film is constituted by a silicon species conductive film, it is preferable to use silicon nitride or the like. Further, in patterning the first electrode, by using a two layers film of silicon oxide and silicon nitride as a mask and leaving the film as it is to use for an etching stopper, excellent patterning can be executed and a charge transmitting portion excellent in flatness can be formed without increasing a number of steps.

Further, according to the invention, there is provided the method of producing a solid image pick-up element, further comprising a step of forming a stopper layer constituting a CMP stopper on the surface of the first electrode prior to the step of forming the second layer conductive film, wherein the flattening step is a step of executing CMP by constituting a stopper by the stopper layer.

By the constitution, CMP can be stopped on the first electrode without machining the first electrode and therefore, a charge transmitting portion having an excellent flatness and a high yield can be formed. Here, when the second layer conductive film is constituted by a silicon species conductive film, it is preferable to use silicon nitride or the like. Further, in patterning the first electrode, by using a two layers film of silicon oxide and silicon nitride as a mask and leaving the film as it is to use for a CMP stopper, excellent patterning can be executed and a charge transmitting portion excellent in flatness can be formed without increasing a number of steps.

BEST MODE FOR CARRYING OUT THE INVENTION

Embodiments of the invention will be explained in reference to the drawings as follows.

First Embodiment

Figure 1A:
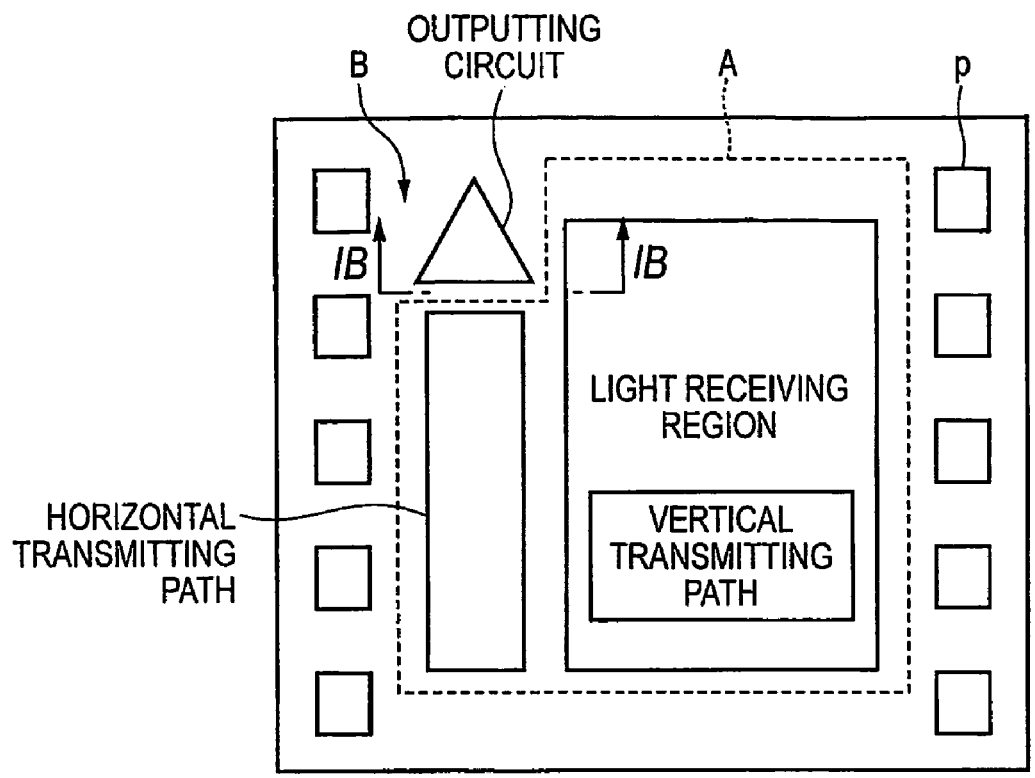
FIG. 1 illustrates views showing a solid image pick-up element according to a first embodiment of the invention.
Figure 1B:
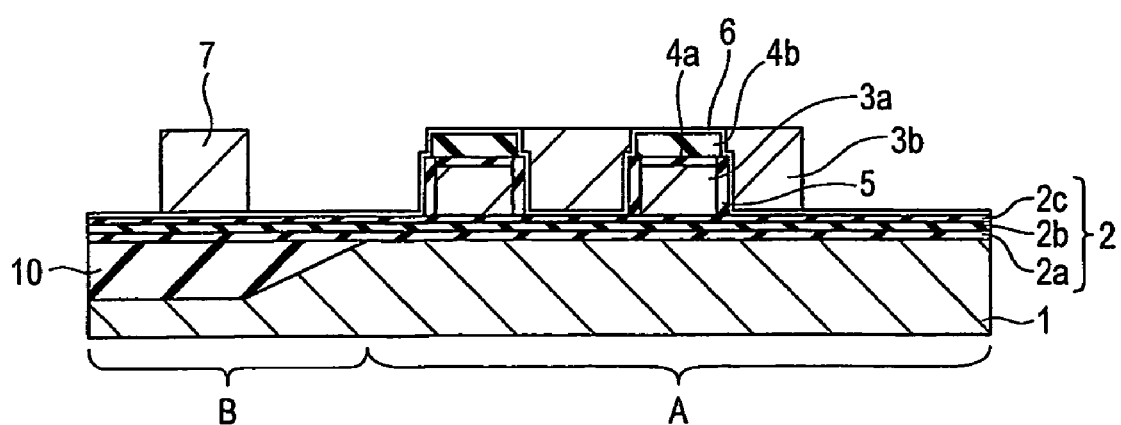

As shown FIGS. 1A and 1B, a solid image pick-up element of the embodiment is characterized in a solid image pick-up element including a photoelectric converting portion, a charge transmitting portion having a charge transmitting electrode for transmitting a charge generated by the photoelectric converting portion, and a peripheral circuit portion including an outputting circuit connected to the charge transmitting portion, and formed by a Recess LOCOS method such that a surface of a field oxide film 10 formed in a frame-like shape to surround an effective image pick-up region (light receiving region) A becomes the same as surface levels of the photoelectric converting portion having a; photosensor and the charge transmitting portion. Here, FIG. 1A is an outline view showing a solid image pick-up element chip, in which the effective image pick-up region is constituted by a light receiving region including the photoelectric converting portion and a vertical transmitting path (a portion of the charge transmitting portion) and a horizontal transmitting path (a portion of the charge transmitting portion) and an outer side of which is formed with the outputting circuit as a peripheral circuit O. Here, notation p designates a pad provided at a peripheral edge portion of the solid image pick-up element chip. Further, the peripheral circuit portion including the outputting circuit corresponds to a nonimage pick-up region B.

Further, as shown by outline explanatory views in FIGS. 1A and 1B, a silicon substrate 1 is formed with a plurality of photodiode regions constituting the photoelectric converting portion, and charge transmitting portions for transmitting a signal charge detected by a photodiode are formed among the photodiode regions. Here, FIG. 1B shows a section provided by cutting FIG. 1A along a line IB-IB.

Figure 10A:
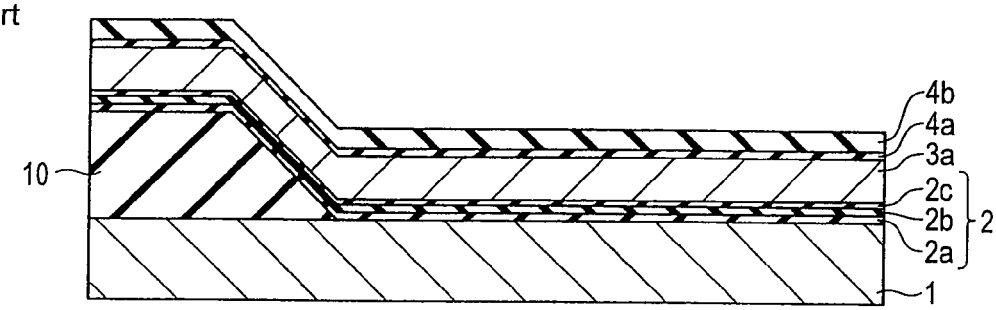
FIG. 10 illustrates views showing steps of producing a solid image pick-up element of a background art.
Figure 10B:
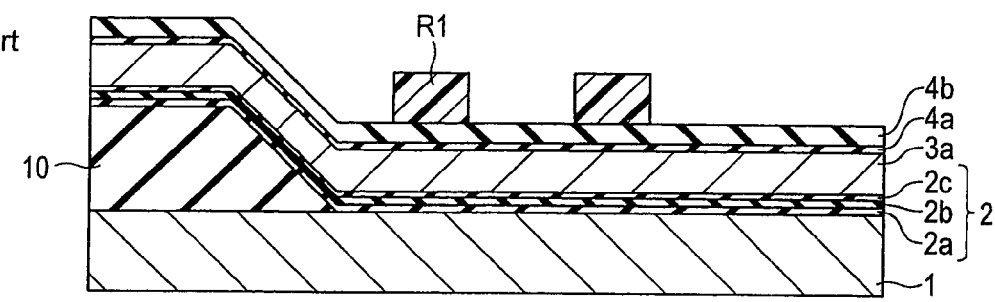
Figure 10C:
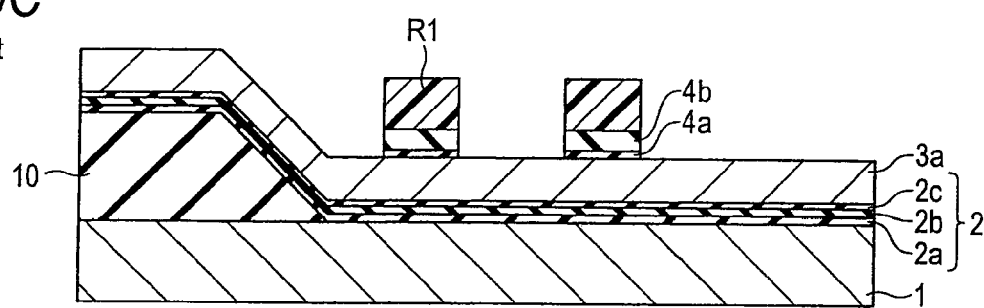
Figure 11D:
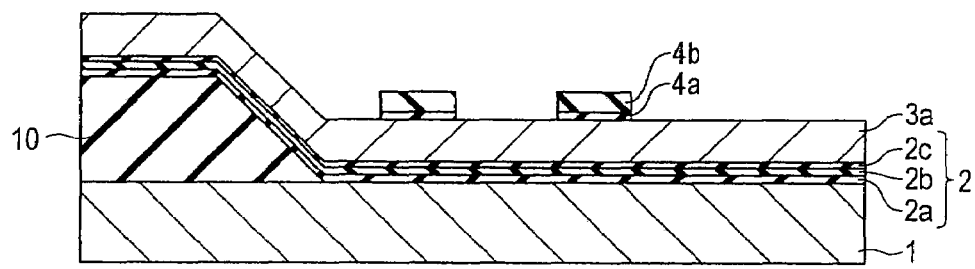
FIG. 11 illustrates views showing steps of producing the solid image pick-up element according to the background art.
Figure 11E:
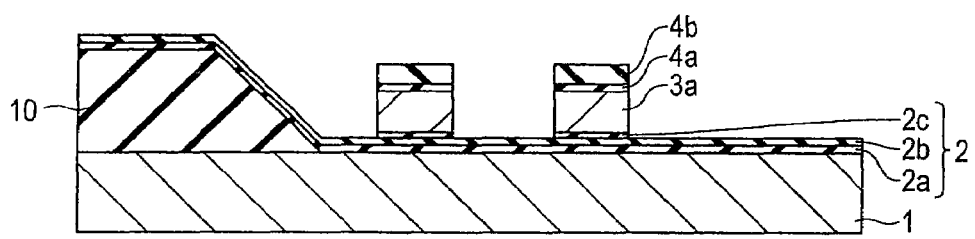
Figure 11F:
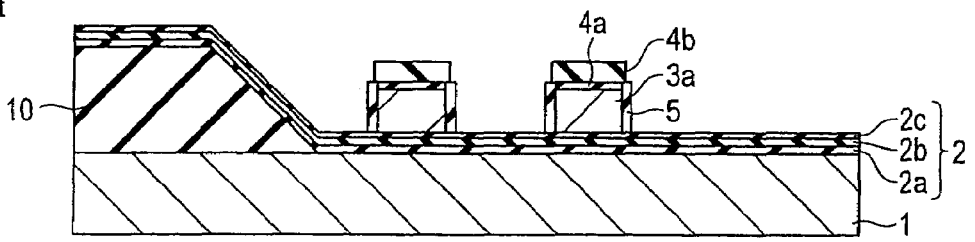
Figure 12G:
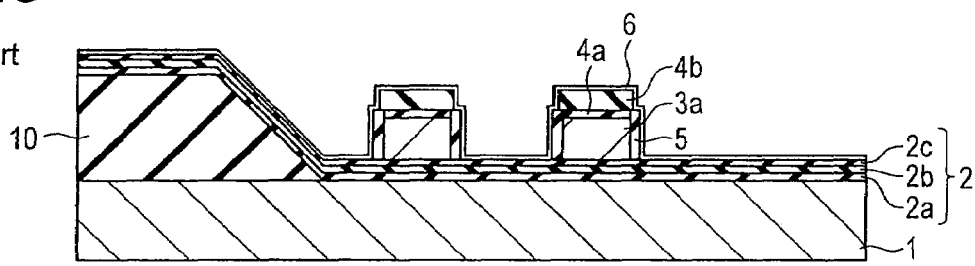
FIG. 12 illustrates views showing steps of producing the solid image pick-up element according to the background art.
Figure 12H:
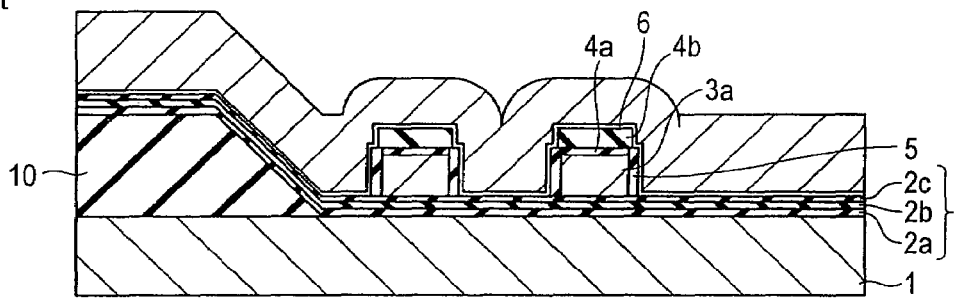
Figure 12I:
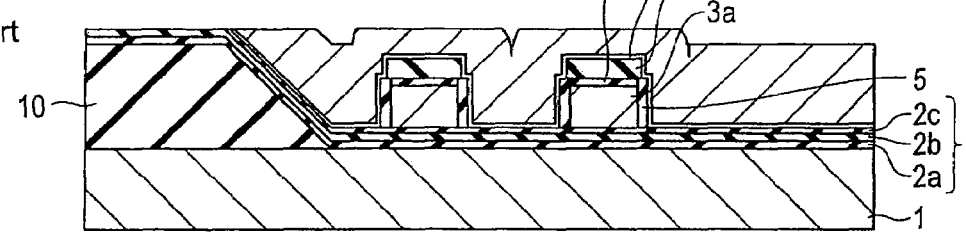

A portion other than the field insulting film is formed similar to that of the solid image pick-up element of an ordinary example shown in FIG. 10 through FIG. 12.

That is, as shown by FIGS. 1A and 1B, the embodiment is characterized in that the field oxide film 10 is formed at inside of a trench T formed at a surface of the substrate 1 and a surface level of the substrate 1 and a surface level of the field oxide film 10 become the same as each other.

Inside of the trench T formed at the surface of the silicon substrate 1 is formed with the field oxide film 10 by selective oxidation and a CMP processing is carried out such that a stepped difference at an interface between the nonimage pick-up region B and the effective image pick-up region A becomes null. Further, the embodiment is constituted such that inside of the silicon substrate 1 is formed with a photoelectric converting portion including a photodiode and a photoelectric current by the photodiode is read via the charge transmitting portion.

Here, inside of the trench T having a depth of about 600 nm formed at an element isolating region of the nonimage pick-up region and the charge transmitting portion of the silicon substrate 1 is formed with a silicon oxide film as the field oxide film 10 having a thickness of 600 nm by selective oxidation. A horizontal transmitting register, a signal processing circuit and a wiring 7 for transmitting a signal charge in a horizontal direction are formed on the field oxide film 10.

That is, as shown by a plane view of the solid image pick-up element chip and the sectional view taken along the line IB-IB in FIGS. 1A and 1B, at inside of the silicon substrate 1, inside of the effective image pick-up region (light receiving region) A surrounded by the field oxide film 10 is formed with the photoelectric converting portion having the photodiode and the charge transmitting portion and an upper layer thereof is covered by an insulating film.

Further, the wiring 7 is formed on the field oxide film 10, a middle layer (not illustrated) including a flattened film is formed at a further upper layer thereof, and an optical system (not illustrated) comprising a color filter (not illustrated) and a microlens (not illustrated) is provided at further upper layer thereof.

According to such a constitution, as shown by FIGS. 1A and 1B, a pattern is formed at the flat surface and therefore, the pattern can be formed extremely highly accurately and an extremely fine charge transmitting portion can be formed. Further, also the wiring including the peripheral circuit portion can be miniaturized.

Next, steps of producing the solid image pick-up element according to the embodiment will be explained in reference to FIG. 2 through FIG. 6.

Figure 2A:
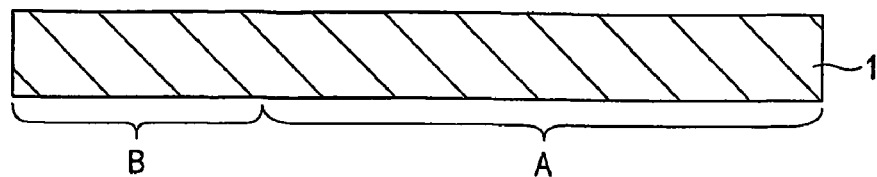
FIG. 2 illustrates views showing steps of producing the solid image pick-up element according to the first embodiment of the invention.

First, as shown by FIG. 2A, the silicon substrate 1 of an n-type is prepared.

Further, a silicon oxide film M1 and a silicon nitride film M2 for buffer are formed and patterned by photolithography to form a mask pattern having a two layers structure.

Figure 2B:
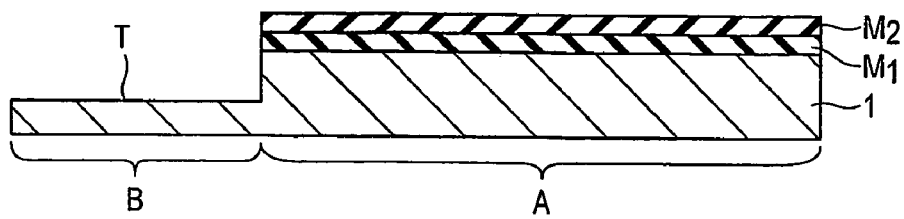

Next, as shown by FIG. 2B, the surface of the substrate is etched to remove by constituting a mask by the mask pattern to form the trench T at the surface.

Figure 2C:
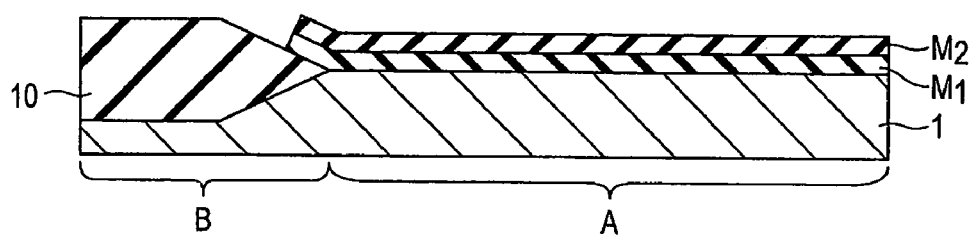

Under the state, by heating in an oxidizing atmosphere at 900° C., as shown by FIG. 2C, the field oxide film 10 comprising a silicon oxide film having a film thickness of about 400 through 600 nm is formed.

Figure 2D:
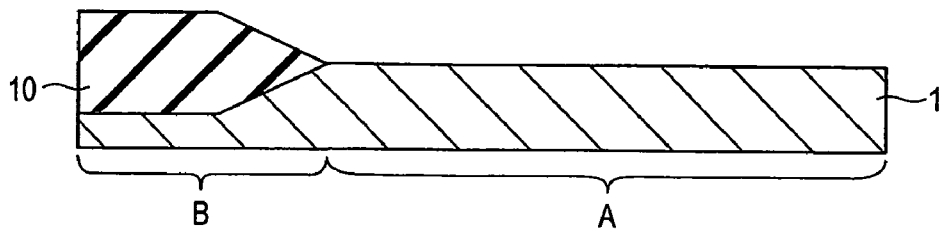

Further, as shown by FIG. 2D, the silicon nitride film M2 is removed.

Figure 2E:
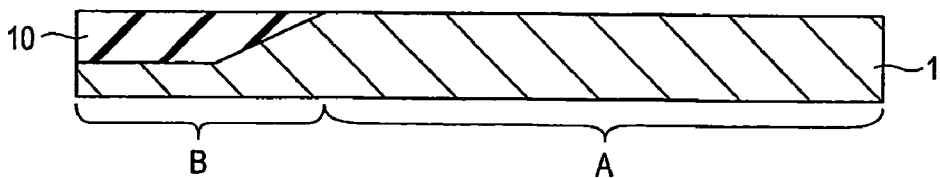

Finally, as shown by FIG. 2E, by flattening by CMP, the field oxide film 10 having a flat surface without a stepped difference at all is formed. At this occasion, also the oxide silicon film M1 is removed.

A charge transmitting channel 33 for moving a signal charge transmitted by the charge transmitting electrode is formed in a direction intersecting with a direction of extending the charge transmitting portion although not illustrated in FIG. 1A.

Inside of the silicon substrate 1 is formed with the photoelectric converting portion, the charge transmitting channel, a channel stop region and a charge reading region, and the surface of the silicon substrate 1 is formed with the gate oxide film 2. A surface of the gate oxide film 2 is formed with the interelectrode insulating film 5 comprising an oxide silicon film and the charge transmitting electrode (the first electrode comprising the first layer doped amorphous silicon film 3a and the second electrode comprising the second layer doped amorphous silicon film 3b) comprising silicon oxide films.

Although the charge transmitting portion is as described above, a middle layer is formed at an upper face of the charge transmitting electrode of the charge transmitting portion. The middle layer is constituted by a light blocking film, an insulting film comprising BPSG (boro-phospho silicate glass), an insulting film (passivation film) comprising P—SiN, and a flattened layer comprising a transparent resin film.

The light blocking film is provided on an upper side of the solid image pick-up element excluding a light detecting portion of the photoelectric converting portion, and the color filter and the microlens are provided further. Further, the flattened layer comprising an insulting transparent resin or the like is filled between the color filter and the microlens.

Further, although in FIG. 1, the solid image pick-up element having a so-to-speak honeycomb structure is shown, the embodiment is naturally applicable to a solid image pick-up element of a tetragonal lattice type.

Next, a detailed explanation will be given of steps of forming the solid image pick-up element on the surface of the silicon substrate formed with the field oxide film in this way in reference to FIG. 3 through FIG. 5.

First, the surface of the silicon substrate 1 of the n-type having an impurity concentration of about $1.0 \times 10^{16}$ cm$^{-3}$ is formed with the silicon oxide film 2a having the film thickness of 15 through 35 nm, the silicon nitride film 2b having the film thickness of 50 nm and the silicon oxide film 2c having the film thickness of 10 nm to thereby form the gate oxide film 2 of a three layers structure.

Successively, the first layer doped amorphous silicon film 3a doped with phosphor having the film thickness of 0.4 μm is formed on the gate oxide film 2 by a reduced pressure CVD method using SiH$_4$ added with PH$_3$ and N$_2$ as a reactive gas. The temperature of the substrate at this occasion is set to 600 through 700° C.

Figure 3A:
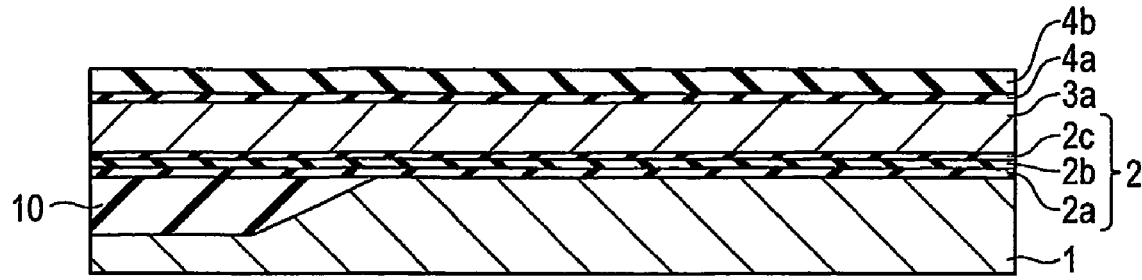
FIG. 3 illustrates views showing steps of producing the solid image pick-up element according to the first embodiment of the invention.

Thereafter, the silicon oxide film 4a having the film thickness of 15 nm and the silicon nitride film 4b having the film thickness of 50 nm are formed by the reduced pressure CVD method (FIG. 3A).

Figure 3B:
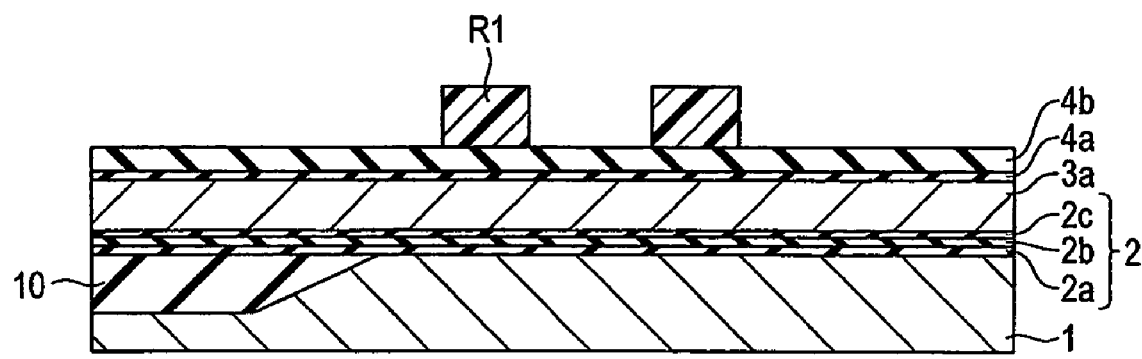

Successively, a positive resist is coated on an upper layer thereof to constitute a thickness of 0.5 through 1.4 μm, exposure, development and rinsing are carried out by using a desired mask by photolithography, and the resist pattern R1 is formed and a dummy (resist) pattern (not illustrated here) is formed as necessary (FIG. 3B). Here, the dummy pattern is formed in layout such that an interval from the resist pattern R1 does not become equal to or lager than a predetermined width (interval of the first electrode) at a peripheral edge portion of the silicon substrate 1.

Figure 3C:
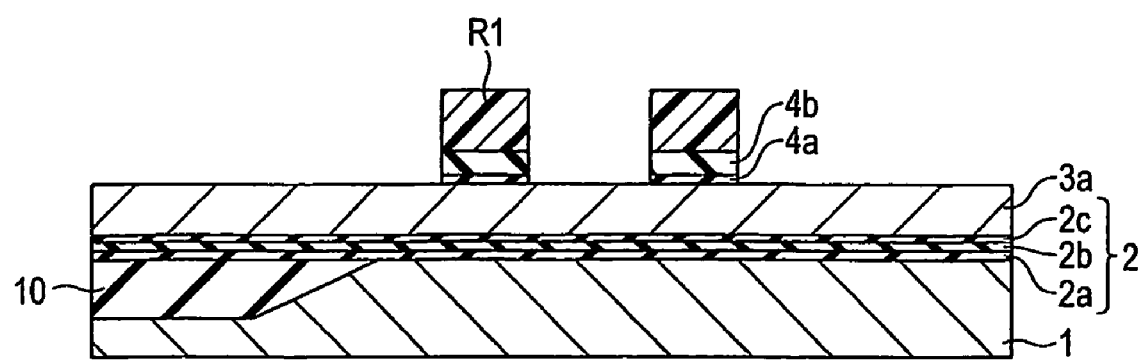

Thereafter, by reactive ion etching using a mixture gas of CHF$_3$, C$_2$F$_6$, O$_2$ and He, the silicon oxide film 4a and the silicon nitride film 4b are etched to form a mask pattern for patterning the first layer doped amorphous silicon film 3a as a first layer conductive film (FIG. 3C). Also in this case, the dummy mask pattern is formed on the left side of the mask pattern for forming the first electrode inherently. Here, the first layer conductive film is patterned by constituting a mask by a mask pattern comprising a two layers film of the silicon oxide film 4a and the silicon nitride film 4b. By using the hard mask as a mask, in comparison with a case of constituting a mask by a resist pattern, patterning with a higher accuracy can be executed.

Figure 4D:
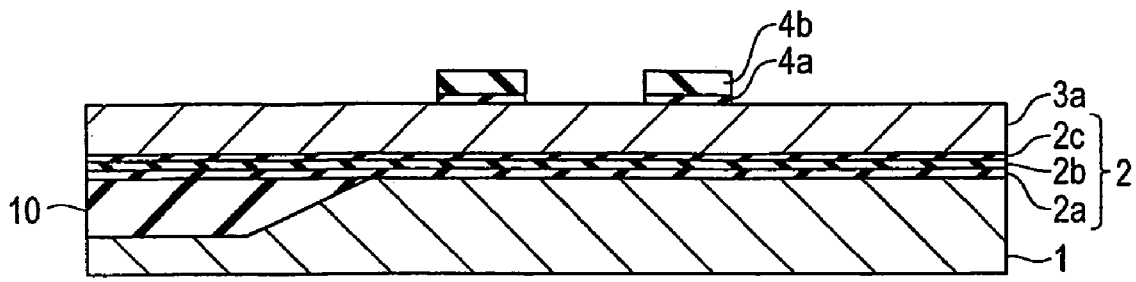
FIG. 4 illustrates views showing steps of producing the solid image pick-up element according to the first embodiment of the invention.

Further, the resist pattern is exfoliated to remove by ashing (FIG. 4D). At this occasion, the first layer doped amorphous silicon film 3a is formed with the dummy pattern in addition to the inherent pattern of the first electrode on the left side of the portion.

Figure 4E:
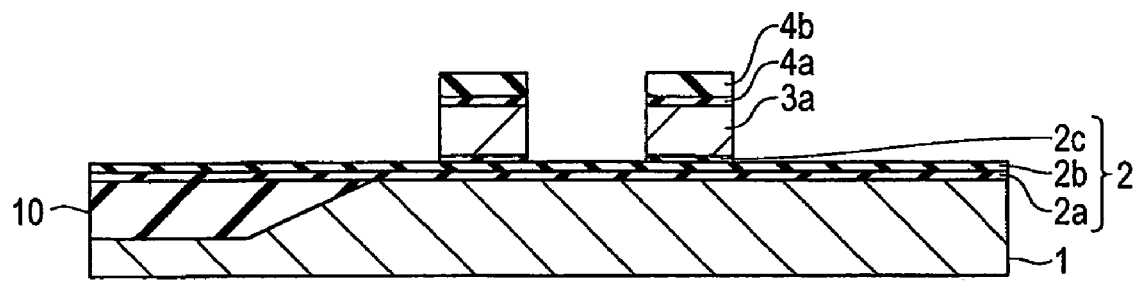

Thereafter, by reactive ion etching using a mixture gas of HBr and O$_2$, the first layer doped amorphous silicon film 3a is selectively etched to remove by constituting a mask by the mask pattern and constituting an etching stopper by the silicon nitride film 2b of the gate oxide film 2 to form the first electrode and the wiring of the peripheral circuit (FIG. 4E). In this case, it is preferable to use an etching apparatus of an ECR (Electron Cyclotron Resonance) type or an ICP (Inductivity Coupled Plasma) type.

Figure 4F:
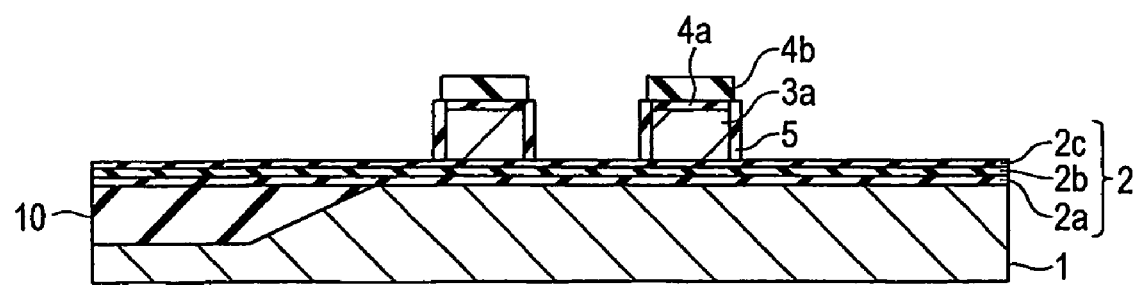

Successively, by an oxidizing method, a side face of the pattern of the first electrode is formed with the interelectrode insulting film 5 comprising a silicon oxide film having the film thickness of 80 nm (FIG. 4F).

Figure 5G:
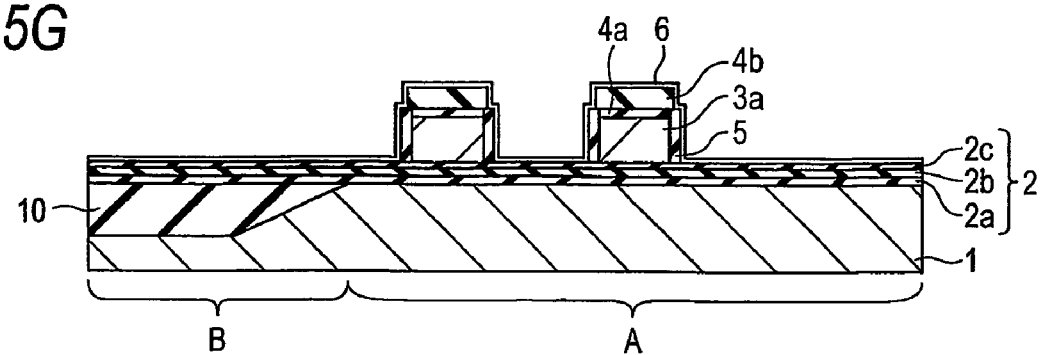
FIG. 5 illustrates sectional views showing steps of producing the solid image pick-up element according to the first embodiment of the invention.
Figure 5H:
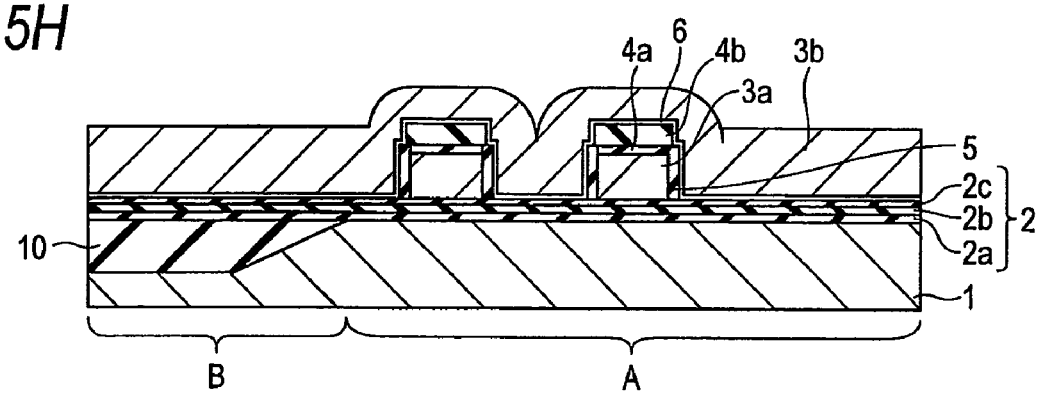

Next, an outer side thereof is covered by a silicon oxide film (HTO) 6 by oxidation at a high temperature (FIG. 5G). Further, by a reduced CVD method using a reactive gas of SiH$_4$ gas added with PH$_3$ and N$_2$, the second layer doped amorphous silicon film 3b having the film thickness of 0.4 through 0.7 μm is formed as the second layer conductive film (FIG. 5H). At this occasion, it is necessary that the film thickness of the second layer doped amorphous silicon film 3b is to a degree the same as a total film thickness of film thicknesses of the first layer doped amorphous silicon film 3a as well as the silicon oxide film 4a and the silicon nitride film 4b at layers thereabove or thicker.

Further, the surface formed with the second layer doped amorphous silicon film 3b is coated with a resist to completely flatten the surface level. Here, as a resist, OFPR 800 is used to coat by the film thickness of 700 through 800 nm.

Figure 5I:
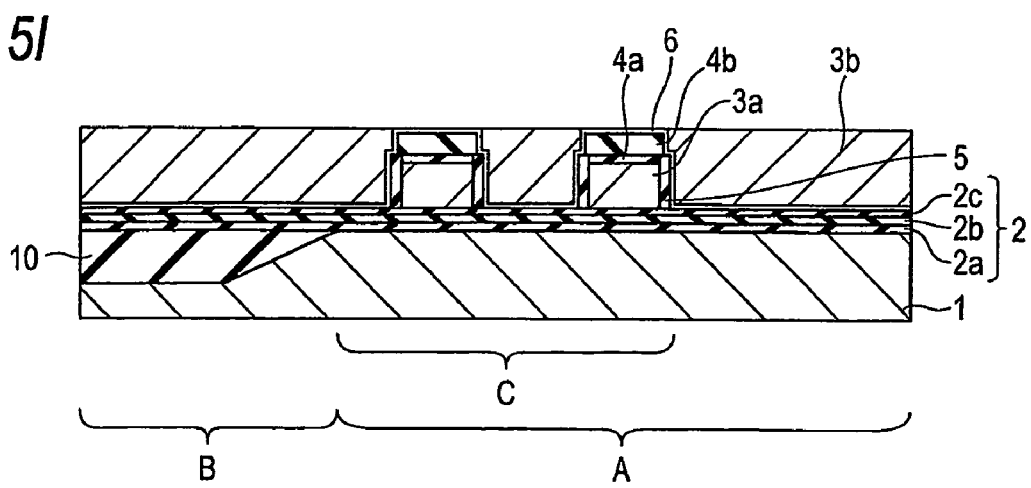

Successively, as shown by FIG. 5I, a total face thereof is etched under a condition that etching rates of the resist and the second layer doped amorphous silicon film 3b become substantially the same to flatten the second layer doped amorphous silicon film 3b. At this occasion, the silicon nitride film 4b used as the mask in the step of patterning the first electrode constitutes an etching stopper and therefore, flattening can be carried out with the excellent controllability.

Figure 6J:
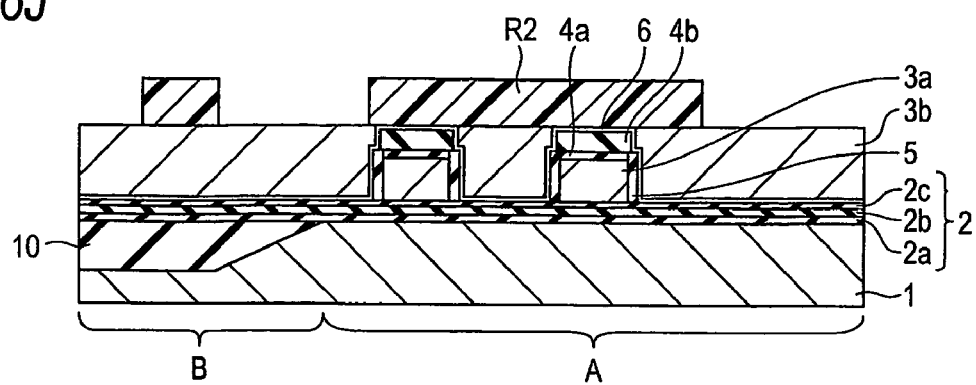
FIG. 6 illustrates sectional views showing steps of producing the solid image pick-up element according to the first embodiment of the invention.

Thereafter, as shown by FIG. 6J, a resist pattern R2 for forming the peripheral circuit is formed. Here, the resist pattern R2 is formed to cover portions of a solid image pick-up element forming portion and the peripheral circuit portion.

Figure 6K:
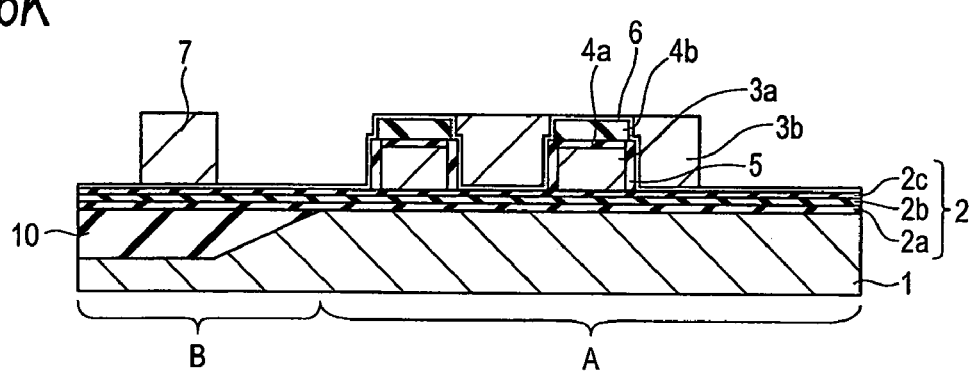

Further, as shown by FIG. 6K, the second layer doped amorphous silicon film 3b above the photodiode region 30 is etched to remove by constituting a mask by the resist pattern R2 and a pattern as the wiring 7 of the peripheral circuit is made to remain.

Further, by removing the resist by ashing, the second layer doped amorphous silicon film 3b is formed to cover portions of the solid image pick-up forming portion and the peripheral circuit portion.

Figure 6L:
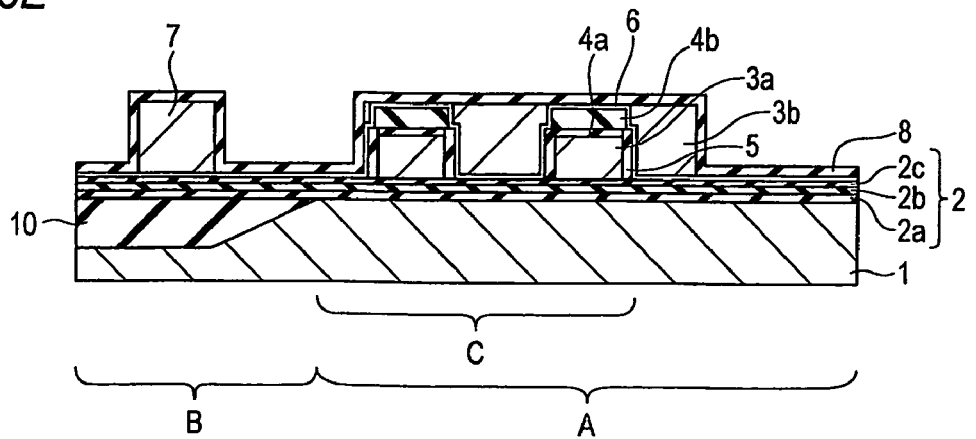

Further, as shown by FIG. 6L, a silicon oxide film 8 is formed at the surface and the second electrode comprising the second layer doped amorphous silicon film 3b is formed to form the charge transmitting electrode having the flat surface.

Figure 7:
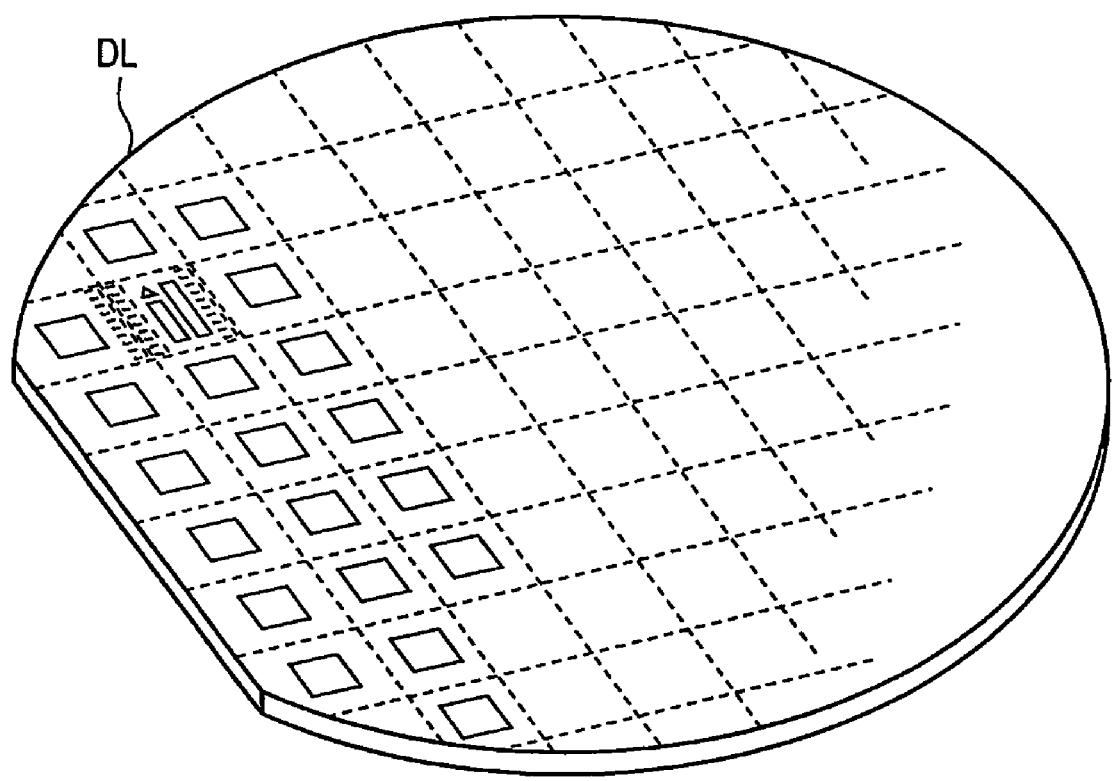
FIG. 7 is a perspective view showing a total of a wafer formed with the solid image pick-up element according to the first embodiment of the invention.

FIG. 7 is a view showing a total of a wafer under the state, which is flat over the total except a scribe line DL.

Further, layers thereabove are formed with a pattern of a light blocking film and a BPSG film having a film thickness of 700 nm, which are made to reflow to flatten at 850° C. Further, a flattened layer comprising an insulating film (passivation film) comprising P—SiN and a transparent resin film is formed.

Thereafter, a color filter, a flattened layer, a microlens and the like are formed to provide the solid image pick-up element as shown by FIGS. 1A and 1B. Further, in FIG. 1B, only an essential portion is shown and an optical system or the like is omitted.

According to the method, the photoelectric converting portion, the charge transmitting portion and the peripheral circuit portion are formed on the surface of the substrate which is completely flattened and is provided with a null stepped difference and therefore, a highly accurate pattern can be realized to form and an operation characteristic which is highly reliable functionally can be achieved.

Further, a dummy pattern may be formed at a location at which a pattern density of the first electrode is small such as a peripheral edge portion of the substrate, particularly at the peripheral edge portion of the substrate such that a surface level of a resist is not lowered in coating the resist by spin coating.

In this way, the highly reliable solid image pick-up element which is fine and without a dispersion in the characteristic can be formed in this way.

Further, although according to the above-described embodiment, the etch back method is adopted as the flattening step, CMP may be used and also in this case, the silicon nitride film 4b used in the step of patterning the first electrode is effectively operated as a CMP stopper and a charge transmitting portion excellent in flatness can be formed.

Further, although according to the above-described embodiment, the high temperature oxidized film 6 is formed after forming the interelectrode insulating film 5 at a surrounding of the first electrode by the reduced pressure CVD method, in place thereof, the interelectrode insulating film may be formed by thermal oxidation. That is, by thermally oxidizing the first electrode by constituting an oxidation preventing film by the silicon nitride film of the two layers film of the silicon oxide film and the silicon nitride film used as the etching stopper in flattening the mask for patterning the first electrode and the second electrode, a silicon oxide film is selectively formed at a side wall of the first electrode to constitute the interelectrode insulting film thereby. In this case, it is necessary to previously form a resist pattern such that a width of the first electrode is increased by an amount of the oxidized region.

Second Embodiment

Although according to the first embodiment, the charge transmitting portion having the single layer electrode structure is formed by the first electrode constituted by the first layer amorphous silicon film and the second electrode constituted by the second layer amorphous silicon film, a charge transmitting portion having a single layer structure may be formed by one layer.

In this case, after forming the first layer amorphous silicon film, patterning may be carried out by a method of photolithography, electron beam lithography or the like.

Third Embodiment

Figure 8:
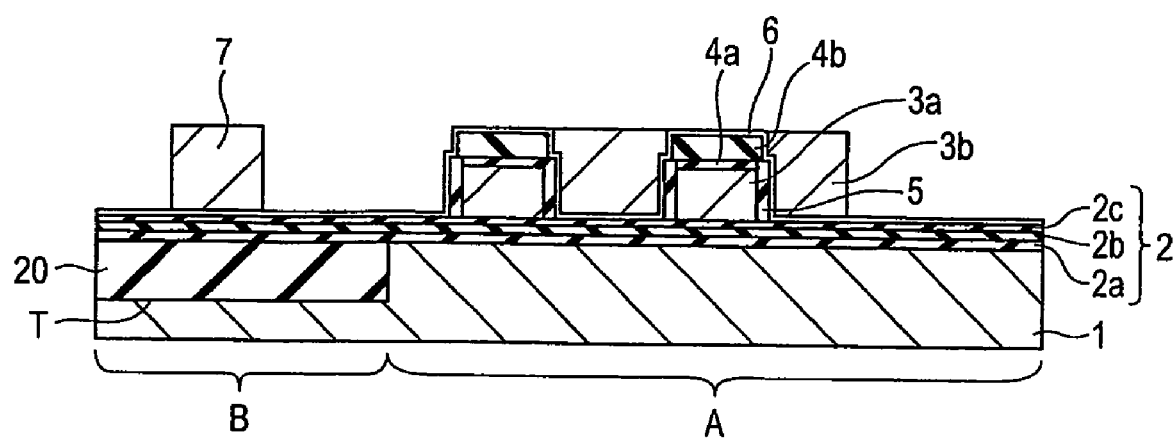
FIG. 8 is a sectional view showing a solid image pick-up element according to a third embodiment of the invention.

Although according to the first embodiment, an explanation has been given of the example of forming the field oxide film by the LOCOS method, it is also effective to fill a silicon oxide film 20 into the trench T by the CVD method and flatten a surface thereof by polishing the surface by CMP as shown by FIG. 8.

Although according to the method, miniaturization can be carried out without a bird's beak in comparison with the case of LOCOS, a problem of being liable to bring about a crack in the trench by thermal strain may be posed.

Fourth Embodiment

Figure 9:
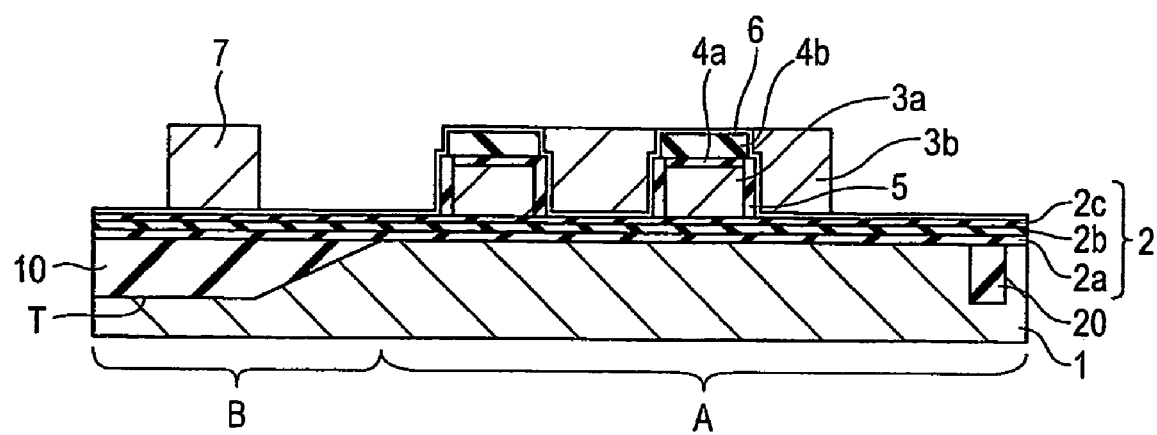
FIG. 9 is a sectional view showing a solid image pick-up element according to a fourth embodiment of the invention.

Although an explanation has been given of the example of forming the field oxide film by the LOCOS method in the first embodiment and with regard to STI (shallow trench insulation) in the third embodiment, a constitution of embedding the silicon oxide film 20 to the trench T and a constitution of forming the insulating film 10 by the LOCOS method may be mixed as shown by FIG. 9.

Although according to the method, miniaturization can be carried out without the bird's beak in comparison with the case of LOCOS, a problem of being liable to bring about a crack in the trench by thermal strain may be posed.

According to the method of the invention, the surface of the field oxide film formed to surround the effective image pick-up region of the solid image pick-up element is disposed such that the surface level is to the degree the same as that of the photoelectric converting portion, that is, the stepped difference becomes null and therefore, highly accurate formation of the solid image pick-up element, particularly a charge transmitting electrode can be achieved. Further, pattern accuracy can be promoted by reducing the stepped difference of the flattened film particularly at a boundary portion of the effective image pick-up region and the nonimage pick-up region by flattening the surface. Further, in flattening the surface by CMP or the resist etch back method, the reduction in the second layer conductive film by the dispersion in the surface level caused by presence or absence of the matrix pattern can be prevented and the solid image pick-up element having the high sensitivity and the high charge transmitting efficiency can be formed.

INDUSTRIAL APPLICABILITY

As has been explained above, according to the invention, the photoelectric converting portion and the charge transmitting portion are formed on the surface of the substrate which is flattened highly accurately and therefore, fine patterning can be carried out, the photoelectric converting portion having a distance between electrodes equal to or smaller than 0.1 μm can easily be formed, a dispersion in the characteristic is reduced, the highly reliable charge transmitting electrode can be provided and therefore, the method is effective in forming the solid image pick-up apparatus which is very small and is provided with a high sensitivity.

The entire disclosure of each and every foreign patent application from which the benefit of foreign priority has been claimed in the present application is incorporated herein by reference, as if fully set forth.

The invention claimed is:

1. A solid image pick-up element comprising:
    a photoelectric converting portion;
    a charge transmitting portion comprising a charge transmitting electrode that transmits a charge generated by the photoelectric converting portion;
    a peripheral circuit portion connected to the charge transmitting portion;
    a wiring layer for the peripheral circuit portion; and
    wherein a surface level of a field oxide film provided at the peripheral circuit portion and the charge transmitting portion to surround an effective image pick-up region of the photoelectric converting portion is to a degree the same as a surface level of the photoelectric converting portion,
    the charge transmitting electrode includes a first electrode, and
    a surface level of the first electrode is substantially the same as a surface level of the wiring layer.

2. The solid image pick-up element according to claim 1, wherein the charge transmitting electrode has a single layer electrode structure comprising a second electrode and said a first electrode formed via an insulting film between electrodes covering a side wall of the second electrode.

3. The solid image pick-up element according to claim 2, wherein the first electrode comprises a first layer conductive film, and the second electrode comprises a second layer conductive film.

4. The solid image pick-up element according to claim 3, wherein the first layer conductive film is provided with a dummy pattern on the field oxide film.

5. The solid image pick-up element according to claim 1, wherein the field oxide film is a film formed by selective oxidation (LOCOS).

6. The solid image pick-up element according to claim 4, wherein the field oxide film is formed in a trench.

7. The solid image pick-up element according to claim 1, wherein the field oxide film is an insulating film filled in a trench.

8. The solid image pick-up element according to claim 1, further comprising;
   a semiconductor substrate; and
   a gate oxide film that is formed between the charge transmitting electrode and the semiconductor substrate,
   wherein the gate oxide film is formed between the wiring layer for the peripheral circuit portion and the semiconductor substrate.

* * * * *